United States Patent [19]
Lee et al.

[11] Patent Number: 5,767,582
[45] Date of Patent: Jun. 16, 1998

[54] SURFACE CONDITIONING INSULATING LAYER FOR FINE LINE CONDUCTIVE PATTERN

[75] Inventors: Eddie Lee, Cupertino; JoAnn Grimley, Santa Clara, both of Calif.

[73] Assignee: Advanced Micro Devices, Inc., Sunnyvale, Calif.

[21] Appl. No.: 789,599

[22] Filed: Jan. 24, 1997

Related U.S. Application Data

[60] Continuation of Ser. No. 529,263, Sep. 15, 1995, abandoned, which is a division of Ser. No. 458,584, Jun. 2, 1995, abandoned.

[51] Int. Cl.$^6$ .......................... H01L 29/00; H01L 23/48
[52] U.S. Cl. .................... 257/753; 257/506; 438/638
[58] Field of Search .......................... 437/189, 173, 437/229; 257/763, 765, 386, 506, 758, 3; 438/689

[56] References Cited

U.S. PATENT DOCUMENTS

| | | | |
|---|---|---|---|
| 4,014,772 | 3/1977 | Woods et al. | 204/180 R |
| 4,946,550 | 8/1990 | Van Laarhoven | 156/643 |
| 5,001,079 | 3/1991 | Van Laarhoven et al. | 437/50 |
| 5,093,279 | 3/1992 | Andreshank et al. | 437/173 |
| 5,262,354 | 11/1993 | Cote et al. | 437/189 |
| 5,393,686 | 2/1995 | Yeh et al. | 437/45 |
| 5,407,529 | 4/1995 | Homma | 437/229 |

OTHER PUBLICATIONS

Joshi, "A New Damascene Structure for Submicrometer Interconnect Wiring," IEEE Electron Letters, vol. 14, No. 3, Mar. 1993, pp. 129–132.

Kaanta et al., "Dual Damascene: A ULSI Wiring Technology," Jun. 11–12, 1991 VMIC Conference, IEEE, pp. 144–152.

Kenny et al., "A Buried–Plate Trench Cell for a 64–Mb DRAM," 1992 Symposium on VLSI Technology Digest of Technical Papers, IEEE, pp. 14–15.

H. Kaigawa et al., "Etching of Thermally Grown $SiO_2$ by $NH_4OH$ in Mixture of $NH_4OH$ and $H_2O_2$ Cleaning Solution," Japanese Journal of Applied Physics, vol. 33, No. 7A, Jul. 1994, 4080–4085.

N. Watanabe et al., "Etching Rates of $SiO_2$ and $Si_3N_4$ Insulating Films in Ammonia Hydrogen–Peroxide Cleaning Process," Extended Abstracts, vol. 83, No. 1, May 1983, Pennington, New Jersey, pp. 221–222.

Primary Examiner—Teresa M. Arroyo

[57] ABSTRACT

The surface of an insulating layer is conditioned by treatment with ammonium hydroxide and hydrogen peroxide, thereby reducing the frequency of shorting between conductive lines of a subsequently formed conductive pattern thereon.

34 Claims, 1 Drawing Sheet

SURFACE CONDITIONING INSULATING LAYER FOR FINE LINE CONDUCTIVE PATTERN

This application is a continuation of application Ser. No. 08/529,263 filed Sep. 15, 1995, now abandoned, which is a division of application Ser. No. 08/458,584 filed Jun. 2, 1995 now abandoned.

TECHNICAL FIELD

The present invention relates to a semiconductor device comprising a substrate having a conductive pattern thereon, and to a process for forming a conductive pattern. The invention has particular application in submicron circuit manufacturing.

BACKGROUND ART

The escalating requirements for density and performance associated with ultra large scale integration semiconductor wiring require responsive changes in interconnection technology, which is considered one of the most demanding aspects of ultra large scale integration technology. High density demands for ultra large scale integration semiconductor wiring require minimal spacing between conductive wiring lines, i.e., an interwiring spacing of less than 1 micron, preferably less than 0.5 microns.

A traditional method for forming interconnection structures comprises the use of a subtractive etching or One such traditional technique comprises depositing a layer of conductive material, such as aluminum or tungsten, on an insulating layer, and patterning the conductive layer in a conventional manner, as by photolithographic and etching techniques, to form a pattern of conductive lines having an interwiring spacing therebetween. A dielectric layer is then applied and planarized, as by etching or chemical-mechanical polishing (CMP).

A recent technique employed to form a conductive pattern comprising conductive lines having an interwiring spacing therebetween comprises the application of the centuries old art of damascene, used for the fabrication of jewelry, to the semiconductor industry. Damascene basically involves the formation of a trench which is filled in with a metal. Thus, damascene differs from the traditional etch back methods of providing an interconnection structure by providing a trench which is filled in with metal followed by planarization; whereas, the traditional etch back technique involves building up a metal wiring layer and filling in the interwiring spaces with a dielectric material. Such applications comprise a single damascene technique wherein photoresist pattern is formed on an insulating layer and openings formed in the insulating layer by etching, such as reactive ion etching. Subsequently, a metal, such as tungsten, is deposited within the openings on the insulating layer, as by chemical vapor deposition. Alternatively, hot aluminum can be formed in the openings and on the insulating layer. Subsequent to metallization, planarization is effected as by etching or CMP. The process is then repeated by depositing a second insulating layer, forming openings, depositing metal and planarizing to obtain an interconnection structure.

An improvement in the single damascene process, called dual damascene, has recently been developed by IBM. See, for example, Joshi, "A New Damascene Structure for Submicrometer Interconnect Wiring," IEEE Electron Letters, Vol. 14, No. 3, March 1993, pp. 129–132; and Kaanta et al., "Dual Damascene: A ULSI Wiring Technology," Jun. 11–12, 1991, VMIC Conference, IEEE, pp. 144–152. The use of a damascene technique wherein the dielectric is planarized by chemical-mechanical polish is discussed in Kenny et al., "A Buried-Plate Trench Cell for a 64-Mb DRAM," 1992, Symposium on VLSI Technology Digest of Technical Papers, IEEE, pp. 14–15.

U.S. Pat. No. 5,262,354 discloses a three-step method of forming electrically conductive vias and lines involving a damascene technique to create lines on a substrate. In addition, this patent discloses the advantages of chemical-mechanical polishing with an aluminum slurry in dilute nitric acid to planarize a dielectric surface. U.S. Pat. No. 5,093,279 discloses a laser ablation damascene process for planarizing metal/polymer structures in the fabrication of both interlevel via metallization and circuitization layers in integrated circuit interconnects.

As densification increases and the distance between the conductive lines of a conductive pattern, i.e., the interwiring spacing, decreases, the frequency of shorting between the conductive lines, particularly at interwiring spacings of less than 1 micron, increases, thereby generating a high rejection rate. Previous attempts to solve this interwiring shorting problem focused upon further reducing contamination in process areas. However, such attempts have not proved successful.

The occurrence of shorting between conductive lines of a conductive pattern presents a major problem in the semiconductor industry causing a high rejection rate with an attendant increase in production time and cost. Accordingly, there exists a need to reduce the frequency of interwiring shorting, particularly in conductive patterns having an interwiring spacing less than 1 micron, such as below 0.5 microns.

DISCLOSURE OF THE INVENTION

An object of the present invention is a semiconductor device having a wiring pattern with an interwiring spacing of less than 1 micron free of shorting between conductive lines.

Another object of the present invention is a method of producing a semiconductor device comprising a conductive pattern of conductive lines with an interwiring spacing of less than 1 micron without shorting between the conductive lines.

Additional objects, advantages and other features of the invention will be set forth in part of the description which follows and in part will become apparent to those having ordinary skill in the art upon examination of the following or may be learned from practice of the invention. The objects and advantages of the invention may be realized and obtained as particularly pointed out in the appended claims.

According to the present invention, the foregoing and other objects are achieved in part by a semiconductor device comprising: a substrate; an insulating layer formed on the substrate; a conductive pattern comprising a plurality of conductive lines having an interwiring spacing therebetween formed on the insulating layer; wherein, the conductive pattern is formed by: treating a surface of the insulating layer with ammonium hydroxide and hydrogen peroxide; and forming the conductive pattern on the treated surface of the insulating layer.

A further object of the present invention is a semiconductor device comprising a substrate; an insulating layer formed on the substrate; a conductive pattern comprising a plurality of conductive lines having an interwiring spacing therebetween formed on the insulating layer; wherein the conductive pattern is formed by treating the surface of the insulating layer with a solution of ammonium hydroxide and hydrogen peroxide for a period of time sufficient to condition the surface, thereby reducing the frequency of shorting between the conductive lines.

Another object of the invention is a method of manufacturing a semiconductor device, comprising: forming an insulating layer on a substrate; treating a surface of the insulating layer with ammonium hydroxide and hydrogen peroxide; and forming a conductive pattern comprising a plurality of conductive lines having an interwiring spacing therebetween on the treated surface of the insulating layer.

A further object of the present invention is a method of manufacturing a semiconductor device, comprising: forming an insulating layer on a substrate; treating the surface of the insulating layer with a solution of ammonium hydroxide and hydrogen peroxide for a sufficient period of time sufficient to condition the surface, thereby reducing the frequency of shorting between conductive lines subsequently formed thereon, and forming a conductive pattern comprising a plurality of conductive lines having an interwiring spacing therebetween on the treated surface of the insulating layer.

Additional objects and advantages of the present invention will become readily apparent to those skilled in this art from the following detailed description, wherein only the preferred embodiment of the invention is shown and described, simply by way of illustration of the best mode contemplated for carrying out the invention.

Figure 1:
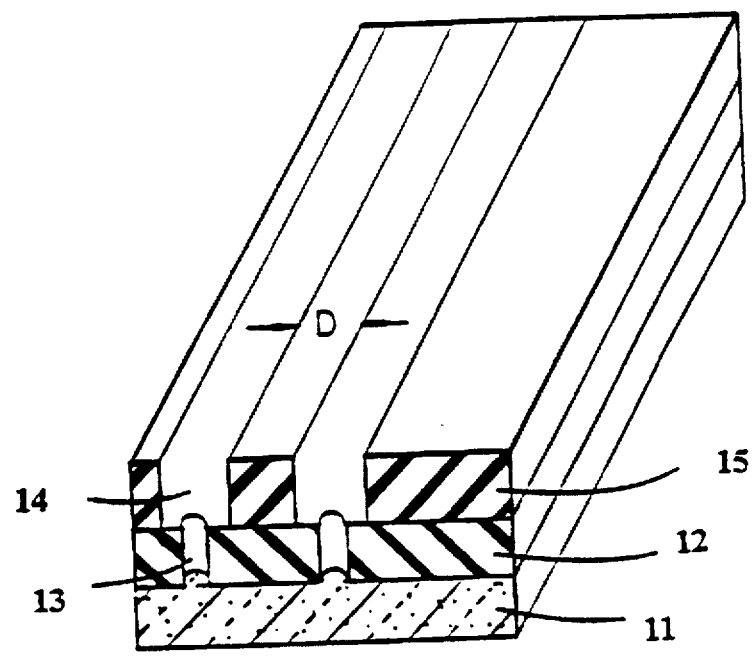
FIG. 1 illustrates the typical wiring pattern that can be formed in accordance with the present invention. As will be realized, the invention is capable of other and different embodiments, and its several details are capable of modifications in various obvious respects, all without departing from the invention. Accordingly, the description is to be regarded as illustrative in nature, and not as restrictive.

During the course of experimentation, the surface of an insulating layer was treated in various ways consistent with the type of treatment to which it would have been exposed during various processing phases. During such experimentation, it was unexpectedly found that the treatment of the surface of an insulating layer with ammonium hydroxide and hydrogen peroxide somehow reduced the frequency of shorting between conductive lines of a conductive pattern subsequently formed on the insulating layer. A solution of ammonium hydroxide and hydrogen peroxide is sometimes employed during initial semiconductor processing, as for cleaning a gate oxide film, or during chemical-mechanical polishing when planarizing a tungsten conductive pattern. It was, therefore, quite unexpected that the treatment of an insulating layer with a solution of ammonium hydroxide and hydrogen peroxide significantly reduced the defect density of a subsequently formed conductive pattern.

These experiments were repeated successfully by initially treating the surface of an insulating layer with ammonium hydroxide and hydrogen peroxide, preferably a solution of ammonium hydroxide, hydrogen peroxide and water, preferably deionized water, for a period of time sufficient to condition the surface. A layer of conductive material was subsequently deposited on the portion of the surface of the insulating layer which had been treated with ammonium hydroxide and hydrogen peroxide, and a conductive pattern comprising a plurality of conductive lines separate by an interwiring spacing formed thereon by conventional photolithographic and etching techniques. It was unexpectedly found that the surface of the insulating layer was altered in some manner by treatment with a solution of ammonium hydroxide and hydrogen peroxide in water, so that the frequency of shorting or defect density between conductive lines of a subsequently formed conductive pattern thereon was

DESCRIPTION OF THE INVENTION

The present invention addresses the problem of shorting between conductive lines of a conductive pattern, which problem is acute in conductive patterns having an interwiring spacing of less than 1 micron, particularly in conductive patterns having an interwiring spacing less than about 0.5 microns. The interwiring shorting problem occurs in conductive patterns regardless of the method by which they are formed, i.e., etch back or damascene techniques. The occurrence of shorting between conductive lines is a serious problem in the semiconductor industry, resulting in a high rejection rate and consequential increased production time and expense.

In attempting to solve the interwiring shorting problem, extensive experimentation was initially conducted focusing on reduced contamination. An experimental procedure was followed comprising forming a conductive pattern by conventional techniques, such as conventional etch back, damascene employing photolithography and etching techniques, and testing to determine the defect, i.e., shorting, density. Continuous efforts were made during processing to minimize contamination from various potential sources, including environmental sources and etching residues. However, a solution to the interwiring shorting problem remained elusive, in that the defect density remained high, causing an economically undesirably rejection rate.

During the course of experimentation, normal semiconductor processing techniques were followed to provide realistic conditions. Such normal semiconductor processing techniques include metal etch back techniques, such as a tungsten etch to etch back tungsten applied to an insulating layer, and CMP. Throughout the course of experimentation, the frequency of interwiring shorting, i.e., defect density, was monitored, dramatically decreased vis-à-vis a similar conductive pattern formed in a similar manner without treating the surface of the insulating layer with the solution of ammonium hydroxide, hydrogen peroxide and water.

Accordingly, the present invention comprises treating the surface of an insulating layer with ammonium hydroxide and hydrogen peroxide, and forming a conductive pattern comprising a plurality of conductive lines having an interwiring spacing therebetween on the treated surface of the insulating layer. The conductive pattern is suitably formed in any conventional manner, such as by a damascene process with subsequent metallization or by depositing a layer of conductive material and employing conventional photolithographic and etching techniques. In employing a damascene process, surface treatment of the insulating layer can be conducted prior to trench formation or after trench formation and prior to deposition of conductive material therein. It was unexpectedly found that the surface of the insulating layer is modified in some manner by treatment with ammonium hydroxide and hydrogen peroxide to effectively reduce shorting between the conductive lines of the subsequently formed conductive pattern on the treated insulating surface.

The particular manner in which the surface of the insulating layer is altered to effect reduction of the frequency of shorting between conductive lines of a subsequently formed conductive pattern on the treated insulating layer is not known. Without wishing to be bound to any particular theory, it is speculated that the surface of the insulating layer is altered by treatment with ammonium hydroxide and hydrogen peroxide so that contamination, such as particulate contamination, which would otherwise cause shorting between conductive lines, is repelled from the treated surface. Thus, in accordance with the present invention, fine line conductive patterns can be formed with minimal interwiring spacings, such as less than about 0.1 micron, preferably less than about 0.5 microns, with a reduced defect density and, hence, reduced rejection rate.

In a preferred embodiment according to the present invention, the surface of the insulating layer is treated for a period of time sufficient to condition the surface so that the frequency of shorting between conductive lines of a subsequently formed conductive pattern on the treated surface of the insulating layer is significantly reduced. In a preferred aspect, the surface of the insulating layer is treated with a solution of ammonium hydroxide and hydrogen peroxide in water, preferably deionized water. The amounts of ammonium hydroxide and hydrogen peroxide, as well as the time and temperature of treatment, are variables which one having ordinary skill in the art could easily optimize in a particular situation to reduce the frequency of shorting between conductive lines of a subsequently formed conductive pattern thereon.

It has been found that a solution containing about 4% to about 15% by volume ammonium hydroxide and about 8% to about 30% by volume hydrogen peroxide can be employed, preferably a solution containing about 6% to about 10% by volume ammonium hydroxide and about 10% to about 20% by volume hydrogen peroxide. In a particularly preferred embodiment, a solution containing about 8% by volume ammonium hydroxide, about 15% by volume hydrogen peroxide and about 77% by volume deionized water is employed. The duration of treatment of the surface of the insulating layer should be sufficient to effect sufficient alteration of the surface to advantageously reduce the frequency of shorting between conductive lines of the subsequently formed conductive pattern thereon. It has been found that about 3 to about 10 minutes is usually sufficient, most preferably about 6 minutes.

The manner in which the surface of the insulating layer is treated is not critical, as long as the surface is sufficiently exposed to the solution of ammonium hydroxide and hydrogen peroxide. Suitable types of treatment comprise rinsing, immersing, spraying, or the use of any of various types of conventional equipment typically employed to apply a fluid to the surface of a solid, such as a semiconductor wafer. For example, it has been found effective treat the surface of the insulating layer with a solution of ammonium hydroxide and hydrogen peroxide in an FSI rotor type system, such as Model FSI Mercury MP, marketed by FSI International, Inc. located in Chanhassan, Minn. In such type of apparatus, the semiconductor wafer is rotated while a solution comprising ammonium hydroxide, hydrogen peroxide and water is applied to the surface of the insulating layer through a nozzle.

The temperature during surface treatment can vary within wide limits. However, it has been found advantageous to conduct treatment between about 70° C. to about 120° C., preferably 80° C. to about 110 °C., most preferably at 100° C. The surface treatment can be conducted at atmosphere pressure. When applying a spray through a nozzle, the pressure can be optimized in a particular situation to achieve a desired reduction of shorting between conductive lines of a subsequently formed conductive pattern.

The insulating layer of the present invention subjected to surface treatment can be any insulating material conventionally employed in the manufacture of semiconductor devices. Preferably, the insulating layer comprises a material selected from the group consisting of oxides, nitrides and oxynitrides. Silicon dioxide, silicon nitride and silicon oxynitride have been found particularly suitable, preferably silicon dioxide, most preferably silicon dioxide derived from deposited tetra ethyl ortho silicate (TEOS). The insulating layer is typically formed on a semiconductor substrate, such as silicon.

The conductive material employed in the present invention can comprise any conductive material conventionally employed in the semiconductor industry to form a conductive pattern, such as aluminum, aluminum-base alloys, such as aluminum copper alloys, refractory metals, compounds or alloys thereof, preferably tungsten and tungsten-base alloys and polysilicon. The conductive layer can also comprise a plurality of layers, including an initial conventional barrier layer of titanium, titanium nitride or titanium-titanium nitride, and a layer of conductive material, such as tungsten, deposited thereon.

The insulating layer and conductive material are formed by any of various conventional techniques. For example, the insulating layer can be formed by thermal oxidation of a deposited silicon layer, spin on techniques, or deposited by chemical vapor deposition (CVD), plasma enhanced chemical vapor deposition (PECVD), or thermal enhanced CVD. The conductive material can be deposited in any conventional manner, as by conventional metallization techniques, preferably, CVD techniques, including low pressure CVD, and PECVD. Low melting point metals can be deposited by melting or sputtering.

In accordance with the present invention, any portion of the insulating layer can be treated with a solution of ammonium hydroxide and hydrogen peroxide to reduce interwiring shorting between conductive lines of a subsequently formed conductive pattern. In a preferred embodiment, treatment is conducted with a solution of ammonium hydroxide and hydrogen peroxide on an unpatterned insulating layer prior to formation of a conductive pattern thereon. Preferably, the insulating layer is silicon dioxide, most preferably formed from deposited TEOS. A typical wiring pattern comprising interwiring spacings to which the claimed invention is applicable is illustrated in FIG. 1 and comprises substrate 11 with insulating layer 12 thereon. Typically, conductive vias 13 are provided through insulating layer 12 extending to substrate 11. In accordance with the present invention, the surface of insulating layer 12 is treated with ammonium hydroxide and hydrogen peroxide under conditions sufficient to reduce the frequency of shorting between subsequently formed conductive lines 14 thereon. As in conventional practices, the spacing between the conductive lines is occupied by dielectric material 15. The present invention advantageously enables formation of a wiring pattern having a minimal interwiring spacing D, such as less than 0.5 µm, with a significant reduction in the frequency of shorting between conductive lines 14.

EXAMPLE

In order to demonstrate the effectiveness of the present invention, comparison testing was conducted wherein a conductive pattern was formed with and without prior treatment of the insulating surface with ammonium hydroxide and hydrogen peroxide. Basically, the processing steps and materials were identical except for the treatment of the insulating surface with a solution of ammonium hydroxide and hydrogen peroxide prior to formation of a conductive pattern thereon. In conducting each test, three separate samples were prepared and run.

Test 1

A silicon semiconductor substrate was coated with a thin film of silicon dioxide derived from TEOS having a thickness of about 4500Å. Without any surface conditioning, a conductive pattern comprising aluminum metal lines was formed by CVD and conventional lithographic and etching techniques. Three different substrates were prepared and the defect density measured. The measured defect densities were 3.08, 3.8 and 2.67 for an average of 3.18.

Test 2

The procedure employed in Test 1 was repeated, except that the surface of the insulating layer was treated with a mixture comprising about 8% by volume ammonium hydroxide, about 15% by volume hydrogen peroxide, and about 77% by volume deionized water, for about 6 minutes at about 100° C., in an FSI rotor system. The three samples exhibited defect densities of 3.4, 3.06 and 1.27, for an average defect density of 2.58. This reduction in defect density caused by treating the surface of the insulating layer with a solution comprising ammonium hydroxide and hydrogen peroxide is unexpected and significant.

The above reported comparison testing demonstrates that treatment in accordance with the present invention of the surface of an insulating layer with a solution of ammonium hydroxide and hydrogen peroxide conditions the surface by altering it so that the frequency of shorting between conductive lines of a subsequently formed conductive pattern thereon is significantly reduced. The present invention has utility in various phases of semiconductor manufacturing, particularly in forming fine line patterns separated by minimal interwiring spacings, preferably less than about 1.0 micron, most preferably less than about 0.5 microns. The present invention is not limited to any particular insulating layer, conductive material, manner of forming the conductive pattern or manner of treating the surface of the insulating layer, as long as the insulating layer is treated with ammonium hydroxide and hydrogen peroxide for a period of time sufficient to condition the surface of the insulating layer, thereby reducing the frequency of shorting between conductive lines subsequently formed thereon. The present invention reduces interwiring shorting of conductive patterns formed in any manner, including by etch back and damascene techniques. Thus, by the present invention, conductive patterns can be formed having interwiring spacings less than 1.0 micron, preferably less than about 0.5 microns, with reduced frequency of interwiring shorting and consequential reduction in rejection rate, increased production speed and reduction in expense.

Only the preferred embodiment of the invention and but a few examples of its versatility are shown and described in the present disclosure. It is to be understood that the invention is capable of use in various other combinations and environments and is capable of changes or modifications within the scope of the inventive concept as expressed herein.

We claim:

1. A semiconductor device, comprising:
    a substrate;
    an insulating layer formed on the substrate;
    a conductive pattern comprising a plurality of conductive lines having an interwiring spacing therebetween formed on the insulating layer; wherein, the interwiring spacing is occupied by dielectric material, and the conductive pattern is formed by:
    treating a surface of the insulating layer with ammonium hydroxide and hydrogen peroxide under conditions sufficient to alter the condition the surface, thereby reducing the frequency of shorting between the subsequently formed conductive lines; and
    forming the conductive pattern directly on the treated surface of the insulating layer.

2. The semiconductor device according to claim 1, wherein the conductive pattern is formed by depositing a layer of conductive material and etching.

3. The semiconductor device according to claim 1, wherein the conductive pattern is formed by a damascene technique comprising forming trenches defining the conductive pattern and depositing a conductive material therein.

4. The semiconductor device according to claim 1, wherein the surface of the insulating layer is treated by rinsing with a solution of ammonium hydroxide and hydrogen peroxide.

5. The semiconductor device according to claim 4, wherein the surface of the insulating material is treated by rinsing with a solution of ammonium hydroxide, hydrogen peroxide and water.

6. The semiconductor device according to claim 5, wherein the water is deionized water.

7. The semiconductor device according to claim 5, wherein the solution contains about 4% to about 15% by volume ammonium hydroxide and about 8% to about 30% by volume hydrogen peroxide.

8. The semiconductor device according to claim 7, wherein the solution contains about 6% to about 10% by volume ammonium hydroxide and about 10% to about 20% by volume hydrogen peroxide.

9. The semiconductor device according to claim 8, wherein the solution contains about 8% by volume ammonium hydroxide, about 15% by volume hydrogen peroxide and about 77% by volume deionized water.

10. The semiconductor device according to claim 4, wherein the surface of the insulating layer is treated for about 3 to about 10 minutes.

11. The semiconductor device according to claim 9, wherein the surface of the insulating layer is treated for about 6 minutes.

12. The semiconductor device according to claim 1, wherein the surface of the insulating layer is treated by immersion in ammonium hydroxide and hydrogen peroxide.

13. The semiconductor device according to claim 4, wherein the surface of the insulating layer is treated by placing the substrate containing the insulating layer into an apparatus in which the substrate is rotated while a solution comprising ammonium hydroxide, hydrogen peroxide and water is applied to the surface of the insulating layer.

14. The semiconductor device according to claim 1, wherein the conductive pattern comprises a metal.

15. The semiconductor device according to claim 14, wherein the metal is tungsten.

16. The semiconductor device according to claim 14, wherein the conductive pattern comprises a barrier layer.

17. The semiconductor device according to claim 15, wherein the conductive pattern comprises a barrier layer.

18. The semiconductor device according to claim 16, wherein the barrier layer comprises titanium, titanium nitride or titanium-titanium nitride.

19. The semiconductor device according to claim 17, wherein the barrier layer comprises titanium, titanium nitride or titanium-titanium nitride.

20. The semiconductor device according to claim 1, wherein the interwiring spacing is less than about 1 micron.

21. The semiconductor device according to claim 20, wherein the interwiring spacing is less than about 0.5 microns.

22. The semiconductor device according to claim 1, wherein the insulating layer comprises a material selected from the group consisting of oxides, nitrides and oxynitrides.

23. The semiconductor device according to claim 22, wherein the insulating material comprises silicon dioxide.

24. The semiconductor device according to claim 22, wherein the insulating material comprises silicon nitride.

25. The semiconductor device according to claim 22, wherein the insulating material comprises silicon oxynitride.

26. The semiconductor device according to claim 1, wherein the surface of the insulating layer is treated under elevated temperature and/or elevated pressure.

27. The semiconductor device according to claim 26, wherein the ammonium hydroxide and hydrogen peroxide are applied to the surface of the insulating layer through a nozzle.

28. The semiconductor device according to claim 27, wherein the substrate is rotated while a solution comprising ammonium hydroxide, hydrogen peroxide and water is applied to the surface of the insulating layer through the nozzle.

29. The semiconductor device according to claim 26, wherein the ammonium hydroxide and hydrogen peroxide are applied to the surface of the insulating layer at an elevated pressure.

30. The semiconductor device according to claim 26, wherein the ammonium hydroxide and hydrogen peroxide are applied to the surface of the insulating layer at an elevated temperature.

31. The semiconductor device according to claim 30, wherein the temperature is about 70° C. to about 120° C.

32. The semiconductor device according to claim 31, wherein the temperature is about 80° C. to about 110° C.

33. The semiconductor device according to claim 1, wherein the interwiring spacing is less than about 1 micron.

34. The semiconductor device according to claim 33, wherein the interwiring spacing is less than about 0.5 microns.

* * * * *